(12) United States Patent
Rowell et al.

(10) Patent No.: US 11,333,705 B2
(45) Date of Patent: May 17, 2022

(54) OVER THE AIR MEASURING DEVICE WITH FEED SWITCHER POSITIONER

(71) Applicant: Rohde & Schwarz GmbH & Co. KG, Munich (DE)

(72) Inventors: Corbett Rowell, Munich (DE); Ralf Meissner, Gilching (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 161 days.

(21) Appl. No.: 16/789,033

(22) Filed: Feb. 12, 2020

(65) Prior Publication Data
US 2021/0165039 A1    Jun. 3, 2021

(30) Foreign Application Priority Data
Nov. 29, 2019    (EP) ...................................... 19212373

(51) Int. Cl.
*G01R 29/08* (2006.01)
*G01R 31/308* (2006.01)

(52) U.S. Cl.
CPC .................................. *G01R 31/308* (2013.01)

(58) Field of Classification Search
CPC ...... G01R 29/08; G01R 29/10; G01R 31/308; H04B 17/103
USPC ..................................................... 324/754.31
See application file for complete search history.

(56) References Cited

U.S. PATENT DOCUMENTS

| 9,906,315 B1* | 2/2018 | Bartko ...................... H01Q 3/04 |
| 2018/0321292 A1* | 11/2018 | Bartko ............... G01R 29/0821 |

FOREIGN PATENT DOCUMENTS

| DE | 102012204916 A1 | 10/2013 |
| DE | 102012204917 A1 | 10/2013 |
| DE | 102012204919 A1 | 10/2013 |
| EP | 3546958 A1 * | 10/2019 ........... H04B 17/101 |

* cited by examiner

Primary Examiner — Jermele M Hollington
Assistant Examiner — Courtney G McDonnough
(74) Attorney, Agent, or Firm — Ditthavong, Steiner & Mlotkowski

(57) ABSTRACT

An over the air measuring device is provided. The over the air measuring device comprises N feed antenna devices, a measuring device, adapted to perform over the air measurements on a device under test, selectively using any one of the N feed antenna devices, and a guide rail adapted to movably hold the N feed antenna devices. The N feed antenna devices are independently movable along the guide rail.

14 Claims, 4 Drawing Sheets

OVER THE AIR MEASURING DEVICE WITH FEED SWITCHER POSITIONER

PRIORITY

The present application claims priority of European patent application EP 19 212 373.5 filed on Nov. 29, 2019, which is incorporated by reference herewith.

FIELD OF THE INVENTION

The present invention relates to automatically performing over the air measurements on a device under test throughout a wide frequency range.

BACKGROUND OF THE INVENTION

When performing over the air measurements on a device under test, a feed antenna is used for transmitting a measuring signal to the device under test or for receiving a measuring signal from the device under test. Such a feed antenna has a usable frequency range. Modern communications standards though are specified for very wide frequency ranges, possibly exceeding the usable frequency range of a single feed antenna. For this reason, measuring systems using a plurality of interchangeable feed antennas can be used.

Manually exchanging the feed antenna for performing measurements at different frequency ranges though is very cumbersome and leads to a long duration of a measurement.

In industrial automation, positioning systems are known. For example, the document DE 10 2012 204 919 A1 shows such an automatic positioning system.

Accordingly, there is a need to provide an over the air measuring device and system, which allows for performing measurements on a device under test in a large frequency range while requiring only minimal operator involvement.

SUMMARY OF THE INVENTION

In the following, parts of the description and drawings referring to embodiments which are not covered by the claims are not presented as embodiments of the invention, but as examples useful for understanding the invention.

According to a first aspect of the invention, an over the air measuring device is provided. The over the air measuring device comprises N feed antenna devices, a measuring device, adapted to perform over the air measurements on a device under test, selectively using any one of the N feed antenna devices, and a guide rail adapted to movably hold the N feed antenna devices, the N feed antenna devices being independently movable along the guide rail. This allows for moving a presently used feed antenna device into a suitable position for performing a measurement while at the same time storing the remaining feed antenna devices. This allows for an over the air measurement, requiring only minimal operator involvement.

Advantageously, the N feed antenna devices are each adapted to transmit first measuring signals to the device under test over the air, and/or receive second measuring signals from the device under test, over the air. Additionally, the measuring device is adapted to generate the first measuring signals and/or measure the second measuring signals. This allows for a very efficient conducting of the measurements.

Preferably, the over the air measuring device comprises a reflector, which is adapted to reflect the first measuring signals after being transmitted, before reaching the device under test, and/or to reflect the second measuring signals after being transmitted, before reaching the one of the N feed antennas performing the measurement. This allows for a very compact geometry of the over the air measuring device.

Preferably, the guide rail comprises a feed antenna device measurement location, adapted to hold any one of the N feed antenna devices during a measurement using said one of the N feed antenna devices. Additionally, a position of a feed antenna of said any one of the N feed antenna devices in the antenna device measuring location is a focal point of the reflector. This allows for achieving far-field conditions at the position of the device under test.

Advantageously and preferably, the over the air measuring device is adapted to perform measurements using only one of the N feed antenna simultaneously. Additionally or alternatively, the over the air measuring device is adapted to perform successive measurements using at least two of the N feed antenna devices. This allows for an automatic measurement in a frequency range larger than the frequency range of a single feed antenna.

Advantageously and preferably, the guide rail comprises at least one feed antenna device storage area, adapted to store N−1 of the N feed antenna devices side by side during a measurement using any one of the N feed antenna devices. The guide rail comprises a feed antenna device measurement location, adapted to hold one of the N feed antenna devices during a measurement using said one of the N feed antenna devices. This allows for a very compact geometry of the over the air measuring device.

Preferably, a distance between any one of the N feed antenna devices being held at the feed antenna device measurement location and any of the further N−1 feed antenna devices being held in the feed antenna device storage area is larger than a distance between any two of the further N−1 feed antenna devices being held in the feed antenna device storage area. This prevents interference between the feed antenna being used for the present measurement and the remaining feed antennas not being used, presently.

Preferably, the guide rail is of a linear shape or of an oval shape or of a U-shape or of a partly linear and partly semi-circular shape. This allows for a very flexible systems design and a compact geometry of the over the air measuring device.

Advantageously, the guide rail is adapted to position the N feed antenna devices individually using at least one linear motor or at least one stepper motor. This allows for an especially high degree of automation and thereby and especially low operator involvement.

Preferably, the N feed antenna devices each comprise alignment means, adapted to hold the feed antenna devices on the guide rail. This allows for an especially accurate positioning.

Advantageously and preferably, the N feed antenna devices each comprise securing means, preferably mechanical means or a magnet, adapted to secure the respective feed antenna device in a feed antenna device measuring location along the guide rail. This allows for an especially exact positioning while performing the measurement.

Advantageously and preferably, the N feed antenna devices and the guide rail are arranged within an anechoic chamber comprised by the over the air measuring device. The measuring device, though, is arranged outside of the anechoic chamber. This allows for an especially compact design of the over the air measuring device while at the same time achieving a high tolerance with regard to interference.

Advantageously and preferably, the over the air measuring device additionally comprises a device under test holder, adapted to hold the device under test. Additionally or alternatively, the device under test holder is a 3D-positioner, adapted to orient the device under test successively in a plurality of orientations. This allows for an especially high degree of automation, further reducing operator involvement.

Advantageously and preferably, the over the air measuring device is adapted to successively position at least two of the N feed antenna devices in a feed antenna device measuring location along the guide rail, successively orient the device under test in a plurality of orientations for every of said feed antennas, and perform a measurement on the device under test using the measuring device at every of said plurality of orientations. This allows for an especially high degree of automation, further reducing the operator involvement.

According to a second aspect of the invention, an over the air measuring system, comprising a previously described over the air measuring device and a device under test is provided. Such an over the air measuring system allows for the performing of measurements on the device under test over a large frequency range while requiring only minimal operator involvement.

BRIEF DESCRIPTION OF THE DRAWINGS

Exemplary embodiments of the invention are now further explained with respect to the drawings, in which.

DETAILED DESCRIPTION OF PREFERRED EMBODIMENTS

Figure 1:
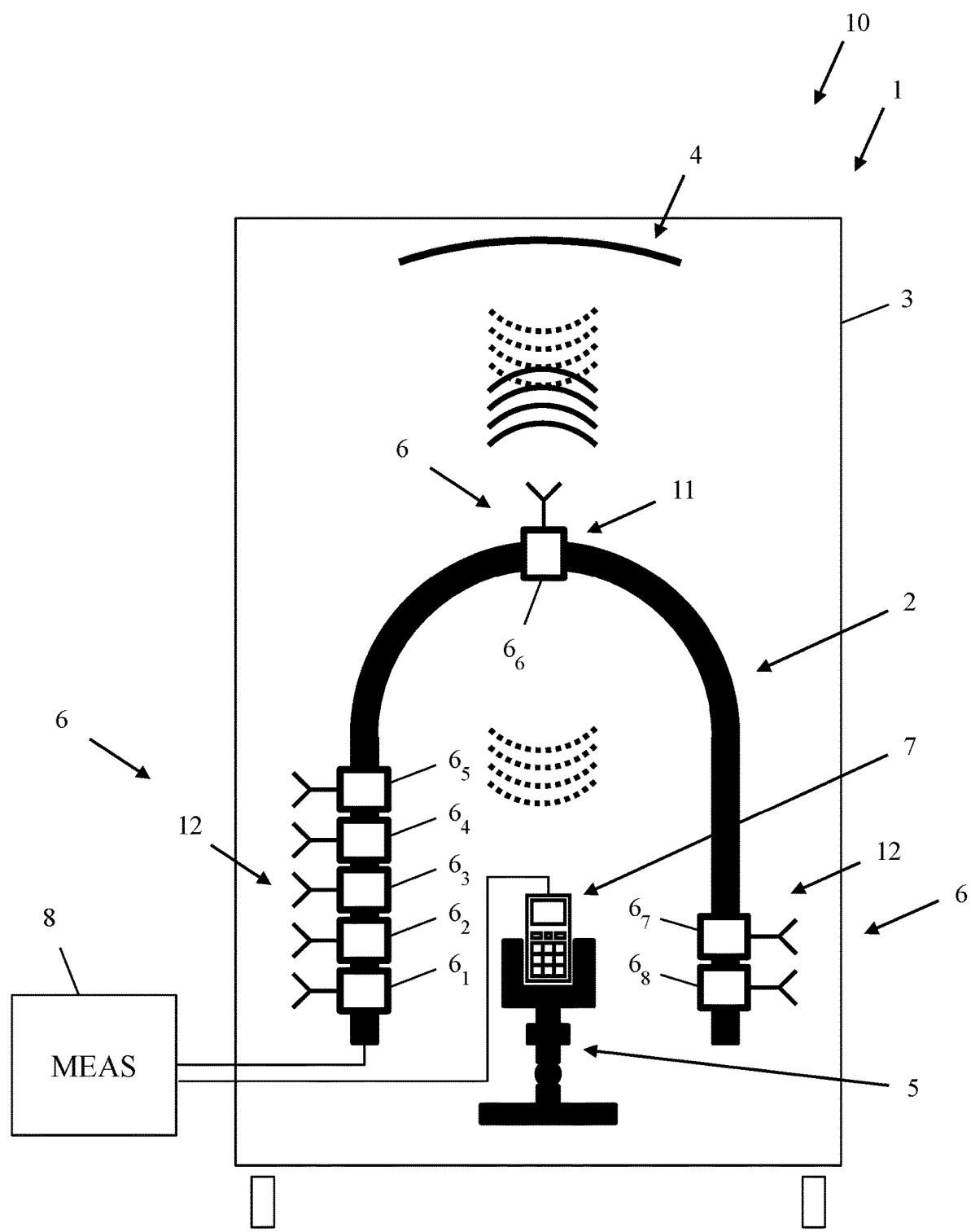
FIG. 1 shows a first embodiment of the over the air measuring device according to the first aspect of the invention in a frontal view.
Figure 2:
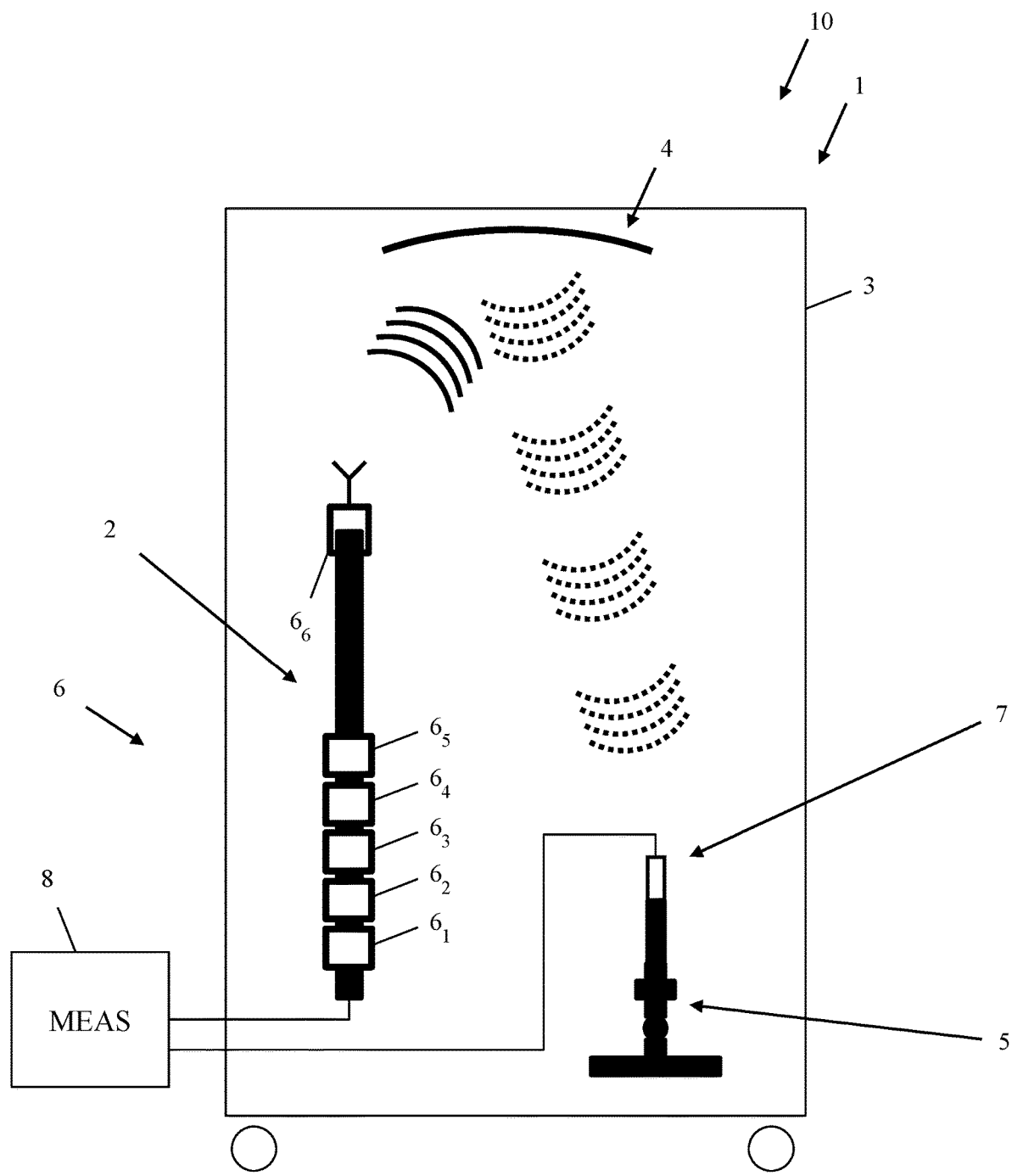
FIG. 2 shows the first embodiment of the over the air measuring device according to the first aspect of the invention in a side-view.

First, we demonstrate the construction and general functioning of a first embodiment of the over the air measuring device along FIG. 1 and FIG. 2. Along FIG. 3 and FIG. 4, different shapes of the guide rail are shown and explained thereafter. Similar entities and reference numbers in different figures have been partially omitted.

In FIG. 1, an embodiment of the inventive over the air measuring system 10 comprising a first embodiment of the inventive over the air measuring device 1 and a device under test 7 is shown.

The over the air measuring device 1 comprises an anechoic chamber 3, and housed therein a guide rail 2 and N feed antenna devices $6_1$, $6_2$, $6_3$, $6_4$, $6_5$, $6_6$, $6_7$ and $6_8$, jointly referred to using the reference number 6. The guide rail 2 movably holds the N feed antenna devices 6. The N feed antenna devices 6 are independently movable along the guide rail 2. Moreover, the anechoic chamber 3 houses a device under test holder 5, which is advantageously a 3D-positioner. The device under test holder 5 holds the device under test 7 in a specified position. The device under test holder 5 is preferably adapted to move and orient the device under test 7 into a plurality of different positions and/or orientations.

Additionally, the over the air measuring device 1 comprises a measuring device 8, which is located outside of the anechoic chamber 3. It is important to note that the anechoic chamber 3 is an optional component. The over the air measuring device 1 is completely functional even without the anechoic chamber 3.

If the over the air measuring device 1 comprises the anechoic chamber 3, the anechoic chamber 3 is preferably arranged on wheels so that it can easily be moved around in a lab-environment. In this case, preferably, the measuring device 8 is attached to the outside of the anechoic chamber 3, facilitating the movement of the over the air measuring device 1.

Preferably, the anechoic chamber 3 is of a width smaller than a typical door frame, especially smaller than 1.2 m, most preferably smaller than 0.8 m.

While in FIG. 1, a frontal view of the over the air measuring device 1 and the over the air measuring system 10 is shown, FIG. 2 shows a side-view of the same. In FIG. 2, it is easily discernible that the guide rail along with the feed antenna devices 6 and the device under test holder 5 along with the device under test 7 are not arranged in the same plane. While they are displayed side by side in the side-view of FIG. 2, they are arranged behind each other in the frontal view of FIG. 1.

In order to perform a measurement on the device under test 7, one of the feed antenna devices 6 is moved along the guide rail 2 into a feed antenna device measuring position 11. The remaining feed antenna devices 6 are moved to at least one, in this embodiment two, feed antenna device storage areas 12 along the guide rail 2.

The feed antenna device measuring position 11 advantageously is at a focal point of the reflector 4.

In a first measuring direction, displayed here, the feed antenna device $6_6$ in the feed antenna device measuring location 11 transmits a first measuring signal to the device under test 7. This first measuring signal though is transmitted not directly to the device under test 7, but is transmitted towards the reflector 4, reflected by the reflector 4, and only thereafter received by the device under test 7.

The first measuring signal emitted by the feed antenna device $6_6$ is depicted with solid lines, while the first measuring signal after reflection by the reflector 4 is depicted with dotted lines. Especially in FIG. 2, it can be clearly seen that the first measuring signal is reflected by the reflector 4 to the device under test 7 and not back to the feed antenna device $6_6$.

Preferably, the feed antenna device $6_6$ used for the measurement as well as the reflector 4 are arranged so that at the position of the device under test 7, there are far-field conditions. In a second measuring direction, the device under test 7 emits a second measuring signal towards the reflector 4, which reflects it towards the feed antenna device $6_6$.

The first measuring signal is provided by the measuring device 8. The second measuring signal is received and measured by the measuring device 8. Optionally, the measuring device 8 is additionally connected to the device under test 7, for example by a cable connection, for performing closed loop measurements.

After a measurement using the feed antenna device $6_6$ has been performed, the feed antenna device $6_6$ is moved from the feed antenna device measuring position 11 to the at least one feed antenna device storage area 12, freeing up the feed antenna device measuring position 11. Then, a further feed antenna device 6 is moved to the feed antenna device measuring position 11, and measurements using this feed antenna device 6 are performed.

Advantageously, the feed antenna devices 6 in the at least one feed antenna device storage area 12 are arranged side by side in close proximity to each other. Especially, the distance between the feed antenna devices 6 in the feed antenna device storage area 12 is smaller, especially significantly smaller than the distance between the feed antenna device $6_6$ in the feed antenna device measuring location 11 to any of the other feed antenna devices 6. This minimizes interference.

Advantageously, the feed antennas of the feed antenna devices 6 in the feed antenna device storage area 12 point into a different direction, advantageously into an at least 90° different direction than a feed antenna of the feed antenna device $6_6$ in the feed antenna device measuring location 11. This also reduces interference.

The feed antenna devices 6 are independently movable along the guide rail 2. Preferably, they are automatically movable by at least one linear motor or at least one stepper motor. Moreover preferably, each of the feed antenna devices comprises alignment means for holding the feed antenna devices on the guide rail. This allows for an especially accurate positioning and movement of the feed antenna devices 6.

Moreover advantageously, each of the feed antenna devices 6 comprises securing means, preferably mechanical means like a screw or a magnet adapted to secure the feed antenna device 6 in the feed antenna device measuring location 11 along the guide rail 2. By latching into position in the feed antenna device measuring location 11, it is assured that the respective feed antenna device $6_6$ does not move during measurements and is positioned perfectly.

In the embodiments shown here, the feed antenna devices 6 are displayed as a single element. In practice, though, the feed antenna devices 6 consist of a feed antenna positioning device and a feed antenna, connected to each other. The feed antenna positioning device serves the purpose of positioning the feed antenna. The feed antenna positioning device is in contact with the guide rail and is independently movable along the guide rail 2.

Figure 3:
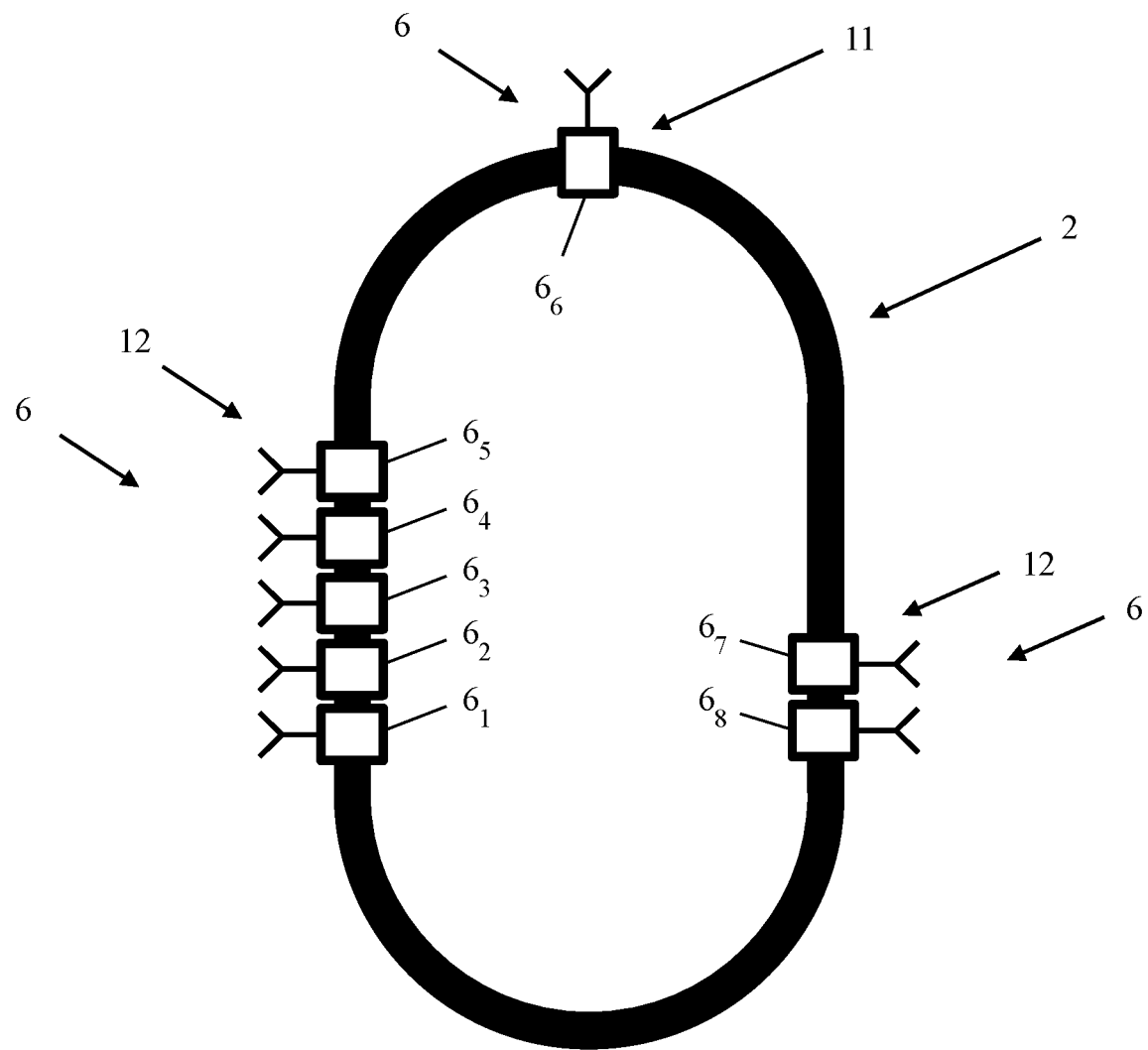
FIG. 3 shows a detail of a second embodiment of the over the air measuring device according to the first aspect of the invention.

In FIG. 3, a detail of a second embodiment of the over the air measuring device is shown. Here, the guide rail 2 has a partly linear and partly semi-circular shape.

Figure 4:
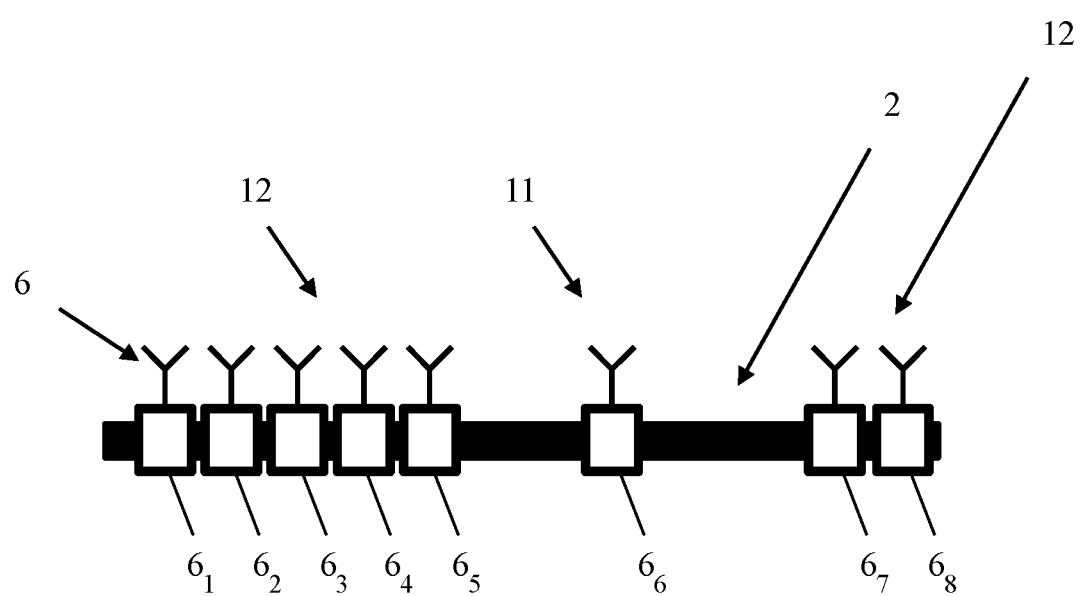
FIG. 4 shows a detail of a third embodiment of the over the air measuring device according to the first aspect of the invention.

In FIG. 4, a third embodiment of the inventive over the air measuring device is shown. Here, the guide rail 2 is of a linear shape.

It should be noted that in the embodiments described before, there are two feed antenna device storage areas 12. This is not to be understood as limiting. Only a single feed antenna device storage area or more than two feed antenna device storage areas may be arranged on the guide rail 2. Preferably, the number of feed antenna devices is 2-20, preferably 3-15, most preferably 4-10.

The entire frequency range of measurements performed by the over the air measuring device is 1 GHz-200 GHz, preferably 3 GHz-100 GHz, most preferably 6 GHz-90 GHz.

An individual frequency range of one of the feed antenna devices is smaller than 100 GHz, preferably smaller than 50 GHz, most preferably smaller than 30 GHz. For example, a first frequency range could be 6-23 GHz, a second frequency range could be 40-60 GHz, and a third frequency range could be 60-90 GHz. Each of these frequency ranges would then be handled by a different feed antenna device 6.

The positioning accuracy of the feed antenna devices 6 along the guide rail is below 10 mm, preferably below 3 mm, most preferably below 0.2 mm.

The invention is not limited to the examples and especially not to a specific number of feed antenna devices, feed antenna device storage areas, and also not limited to specific frequencies. The invention discussed above can be applied to many different communication standards to be measured. The characteristics of the exemplary embodiments can be used in any advantageous combination.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. Over the air measuring device, comprising:
    N feed antenna devices,
    a measuring device, adapted to perform over the air measurements on a device under test, selectively using any one of the N feed antenna devices, and
    a single guide rail, adapted to movably hold the N feed antenna devices, the N feed antenna devices being independently movable along the single guide rail,
        wherein the single guide rail comprises at least one feed antenna device storage area, adapted to store N−1 of the N feed antenna devices side-by-side, during a measurement using one of the N feed antenna devices, and
        wherein the single guide rail comprises a single feed antenna device measurement location, adapted to hold one of the N feed antenna devices during a measurement using said one of the N feed antenna devices.

2. Over the air measuring device according to claim 1,
    wherein the N feed antenna devices each are adapted to
        transmit first measuring signals to the device under test over the air, and/or
        receive second measuring signals from the device under test over the air, and
    wherein the measuring device is adapted to
        generate the first measuring signals, and/or
        measure the second measuring signals.

3. Over the air measuring device according to claim 2,
    comprising a reflector, adapted to
        reflect the first measuring signals after being transmitted, before reaching the device under test, and/or
        reflect the second measuring signals after being transmitted, before reaching the one of the N feed antenna devices performing the measurement.

4. Over the air measuring device according to claim 3,
wherein the single guide rail comprises a feed antenna device measurement location, adapted to hold one of the N feed antenna devices during a measurement using said one of the N feed antenna devices, and
wherein a position of a feed antenna of said one of the N feed antenna devices in the feed antenna device measurement location is a focal point of the reflector.

5. Over the air measuring device according to claim 1,
wherein the over the air measuring device is adapted to perform a measurement using only one of the N feed antenna devices simultaneously, and/or
wherein the over the air measuring device is adapted to perform successive measurements using at least two of the N feed antenna devices.

6. Over the air measuring device according to claim 1,
wherein a distance between one of the N feed antenna devices being held at the feed antenna device measurement location and any of the further N−1 feed antenna devices being held in the feed antenna device storage area is larger than a distance between any two of the further N−1 feed antenna devices being held in the feed antenna device storage.

7. Over the air measuring device according to claim 1,
wherein the single guide rail is of
a linear shape, or
an oval shape, or
a U-shape, or
partly linear and partly semi-circular shape.

8. Over the air measuring device according to claim 1,
wherein the single guide rail is adapted to position the N feed antenna devices individually using a linear motor or a stepper motor.

9. Over the air measuring device according claim 1,
wherein the N feed antenna devices each comprise alignment means, adapted to hold the feed antenna devices on the single guide rail.

10. Over the air measuring device according claim 1,
wherein the N feed antenna devices each comprise securing means, mechanical means, or a magnet, adapted to secure the respective feed antenna device in a feed antenna device measuring location along the single guide rail.

11. Over the air measuring device according to claim 1, comprising an anechoic chamber,
wherein the N feed antenna devices and the single guide rail are arranged within the anechoic chamber, and
wherein the measuring device is arranged outside of the anechoic chamber.

12. Over the air measuring device according to claim 1, comprising a device under test holder, adapted to hold the device under test, wherein the device under test holder is a 3D-positioner, adapted to orient the device under test successively in a plurality of orientations.

13. Over the air measuring device according to claim 12,
wherein the over the air measuring device is adapted to successively position at least two of the N feed antenna devices in a feed antenna device measuring location along the single guide rail,
successively orient the device under test in a plurality of orientations for every of said feed antennas, and
perform a measurement on the device under test using the measuring device at every of said plurality of orientations.

14. Over the air measuring system, comprising an over the air measuring device according claim 1 and a device under test.

* * * * *